US012648161B2

(12) United States Patent
Cheng et al.

(10) Patent No.: US 12,648,161 B2
(45) Date of Patent: Jun. 2, 2026

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Anhao Cheng, Taichung City (TW); Ching-Hung Kao, Tainan City (TW); Yen-Liang Lin, Tainan City (TW); Meng-I Kang, Changhua County (TW); Kai-Chi Wu, Changhua County (TW); Chien-Wei Lee, Taichung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 319 days.

(21) Appl. No.: 17/812,686

(22) Filed: Jul. 14, 2022

(65) Prior Publication Data

US 2024/0021738 A1     Jan. 18, 2024

(51) Int. Cl.
| | |
|---|---|
| *H10D 1/66* | (2025.01) |
| *H10D 1/00* | (2025.01) |
| *H10D 62/10* | (2025.01) |
| *H10D 62/17* | (2025.01) |
| *H10P 30/22* | (2026.01) |

(52) U.S. Cl.
CPC .............. *H10D 1/66* (2025.01); *H10D 1/047* (2025.01); *H10D 62/105* (2025.01); *H10D 62/371* (2025.01); *H10P 30/22* (2026.01)

(58) Field of Classification Search
None
See application file for complete search history.

(56) References Cited

U.S. PATENT DOCUMENTS

| | | | | |
|---|---|---|---|---|
| 2006/0054924 A1* | 3/2006 | Saito | .................... | H10D 62/149 |
| | | | | 257/E29.253 |
| 2006/0099757 A1* | 5/2006 | Kao | .................. | H01L 29/66287 |
| | | | | 257/E29.183 |
| 2008/0017933 A1* | 1/2008 | Kao | .................... | H01L 27/0629 |
| | | | | 438/210 |
| 2008/0111165 A1* | 5/2008 | Kao | ....................... | H10F 39/803 |
| | | | | 257/288 |
| 2008/0272394 A1* | 11/2008 | Kapoor | .............. | H10D 30/0512 |
| | | | | 257/190 |

(Continued)

*Primary Examiner* — Bilkis Jahan
(74) *Attorney, Agent, or Firm* — WPAT LAW; Anthony King

(57) ABSTRACT

A semiconductor structure including a substrate, a first well region, a second well region, an isolation, a gate structure, and a dielectric layer is provided. The first well region is disposed in the substrate, wherein a dopant of the first well region includes arsenic. The second well region is disposed in the substrate under the first well region, wherein the second well region has a conductivity type different from that of the first doping region. The isolation is disposed in the substrate and surrounds the first well region, wherein a depth of the isolation is substantially greater than or equal to a depth of the first well region from a first surface of the substrate. The gate structure are disposed sequentially over the substrate and overlaps the first well region. A method of forming the semiconductor structure is also provided.

20 Claims, 16 Drawing Sheets

(56)  References Cited

U.S. PATENT DOCUMENTS

| | | | |
|---|---|---|---|
| 2011/0227161 A1* | 9/2011 | Zhu | H10D 64/27 |
| | | | 257/E29.264 |
| 2012/0037971 A1* | 2/2012 | Kwon | H10D 1/66 |
| | | | 257/E29.345 |
| 2019/0067124 A1* | 2/2019 | Tsai | H01L 21/31053 |
| 2019/0252269 A1* | 8/2019 | Toyoda | H10D 64/518 |
| 2019/0355808 A1* | 11/2019 | Toyoda | H10D 62/393 |
| 2023/0420551 A1* | 12/2023 | Pandey | H10D 89/713 |

* cited by examiner

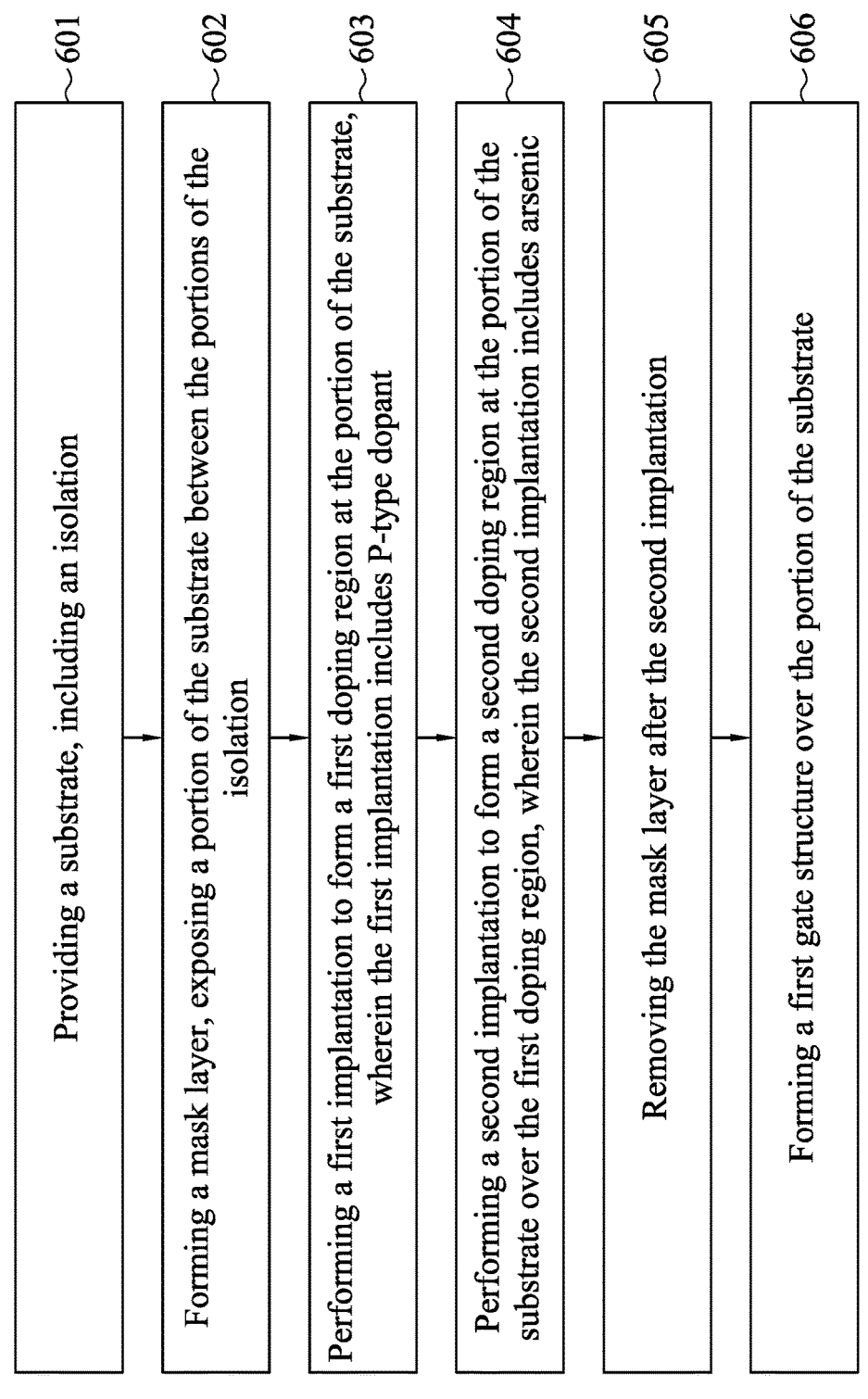

600

601 Providing a substrate, including an isolation

602 Forming a mask layer, exposing a portion of the substrate between the portions of the isolation 603 Performing a first implantation to form a first doping region at the portion of the substrate, wherein the first implantation includes P-type dopant 604 Performing a second implantation to form a second doping region at the portion of the substrate over the first doping region, wherein the second implantation includes arsenic 605 Removing the mask layer after the second implantation 606 Forming a first gate structure over the portion of the substrate

FIG. 3

SEMICONDUCTOR STRUCTURE AND METHOD OF MANUFACTURING THE SAME

BACKGROUND

As a result of size reduction of a semiconductor product, current leakage frequently occurs in recent generations of devices (e.g., those of relatively smaller product sizes). For instance, an analog device is sensitive to noise signals, especially those of high frequency, and a filter device is provided to filter the noise signals. However, with traditional filter devices, an issue of current leakage arises after extensive usage time. Product performance is affected and product lifetime is reduced due to such progressively worsening leakage problem. Improvements in product performance and product lifetime are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale, in fact, dimensions of the various features may be arbitrarily increased or reduced for clarity of discussion.

FIG. 3 is a flow diagram of a method of manufacturing a semiconductor structure in accordance with some embodiments of the disclosure.

DETAILED DESCRIPTION

Figure 1:
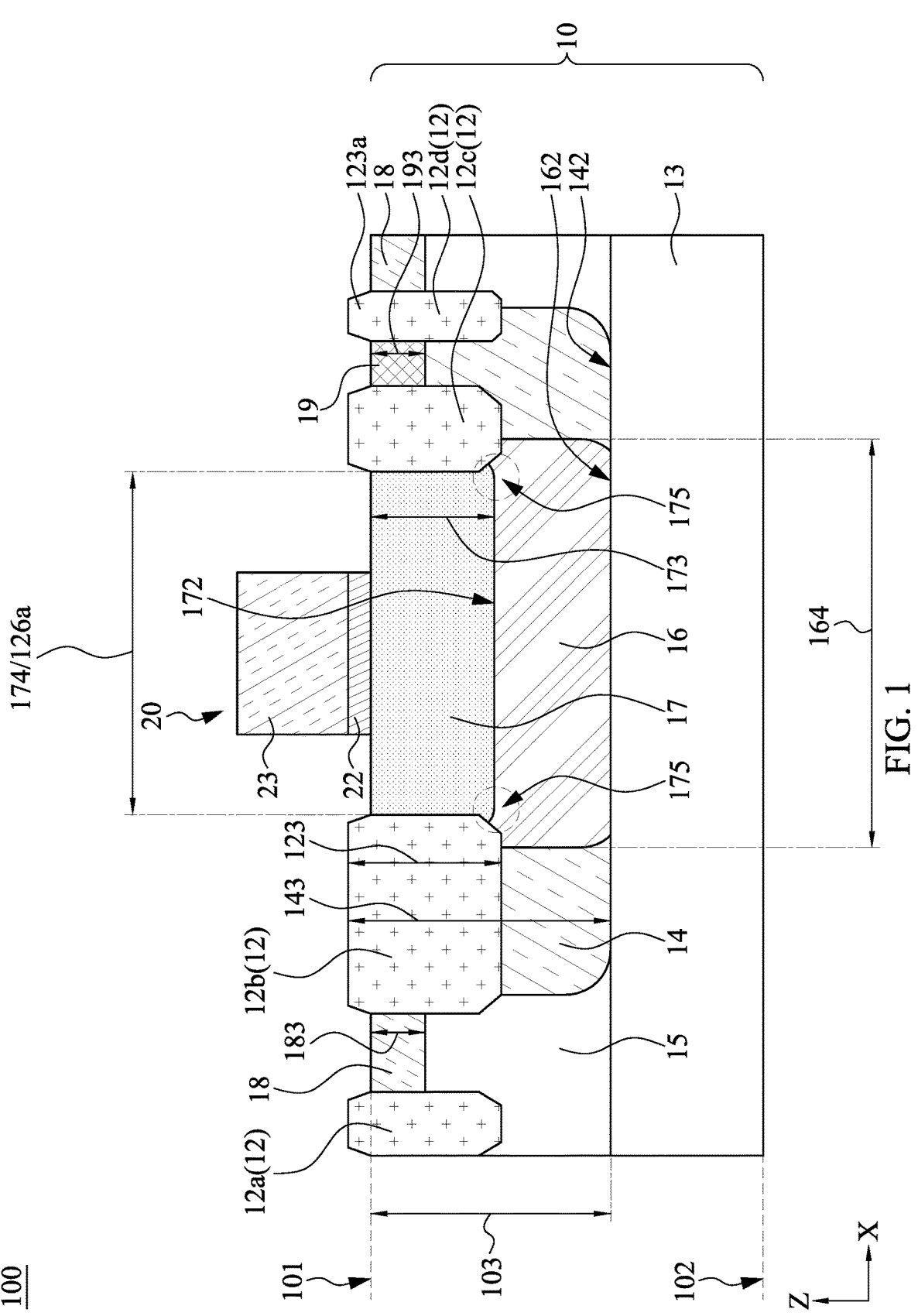
FIG. 1 is a schematic cross-sectional diagram of a semiconductor structure in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another elements(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic cross-sectional diagram of a semiconductor structure 100 in accordance with some embodiments of the present disclosure. The semiconductor structure 100 can include a capacitor 20, which includes an upper electrode 23, a dielectric layer 22 and a lower electrode 17. In some embodiments, the lower electrode 17 is a doping region disposed in a substrate 10 extending from a first surface 101 of the substrate 10. In some embodiments, the dielectric layer 22 is disposed over the lower electrode 17 on the first surface 101 of the substrate 10. In some embodiments, the upper electrode 23 is disposed on the dielectric layer 22. In some embodiments, the upper electrode 23 is a metal gate structure.

The capacitor 20 may be a metal-oxide-semiconductor (MOS) capacitor, and can be an N-type MOS (NMOS) capacitor or a P-type MOS (PHOS) capacitor depending on different applications. For instance, when the MOS capacitor is an NMOS capacitor, the upper electrode 23 includes one or more N-type metals. The N-type metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. For another instance, when the MOS capacitor is a PMOS capacitor, the upper electrode 23 includes one or more P-type metals. The P-type metal may include titanium nitride (TiN), tungsten nitride (WN), tantalum nitride (TaN), ruthenium (Ru) or a combination thereof.

According to a conductivity type of the MOS capacitor to be formed, a conductivity type of the lower electrode 17 can be P type or N type. The conductivity type of the lower electrode 17 is same as the conductivity type of the MOS capacitor. In some embodiments, the lower electrode 17 is an N-type doping region having a relative high doping concentration. The lower electrode 17 may be referred to as an N+ well region or a heavily doped N well region, and includes an N-type dopant. The dopant of the lower electrode 17 may have an atomic number greater than 20 in order to avoid diffusion of the dopants and expansion of the lower electrode 17 after an annealing operation. In some embodiments, the dopant of the lower electrode includes arsenic (As). In other embodiments, antimony (Sb), bismuth (Bi), other suitable N-type dopants, or a combination thereof is used to form the lower electrode 17. In other embodiments, the lower electrode 17 is a P-type doping region having a relative high doping concentration. The lower electrode 17 may be referred to as a P+ well region or a heavily doped P well region, and includes a P-type dopant. In some embodiments, the dopant of the lower electrode 17 has an atomic number greater than 20. In some embodiments, gallium (Ga), indium (In), other suitable P-type dopants, or a combination thereof is used to form the lower electrode 17.

Figure 2:
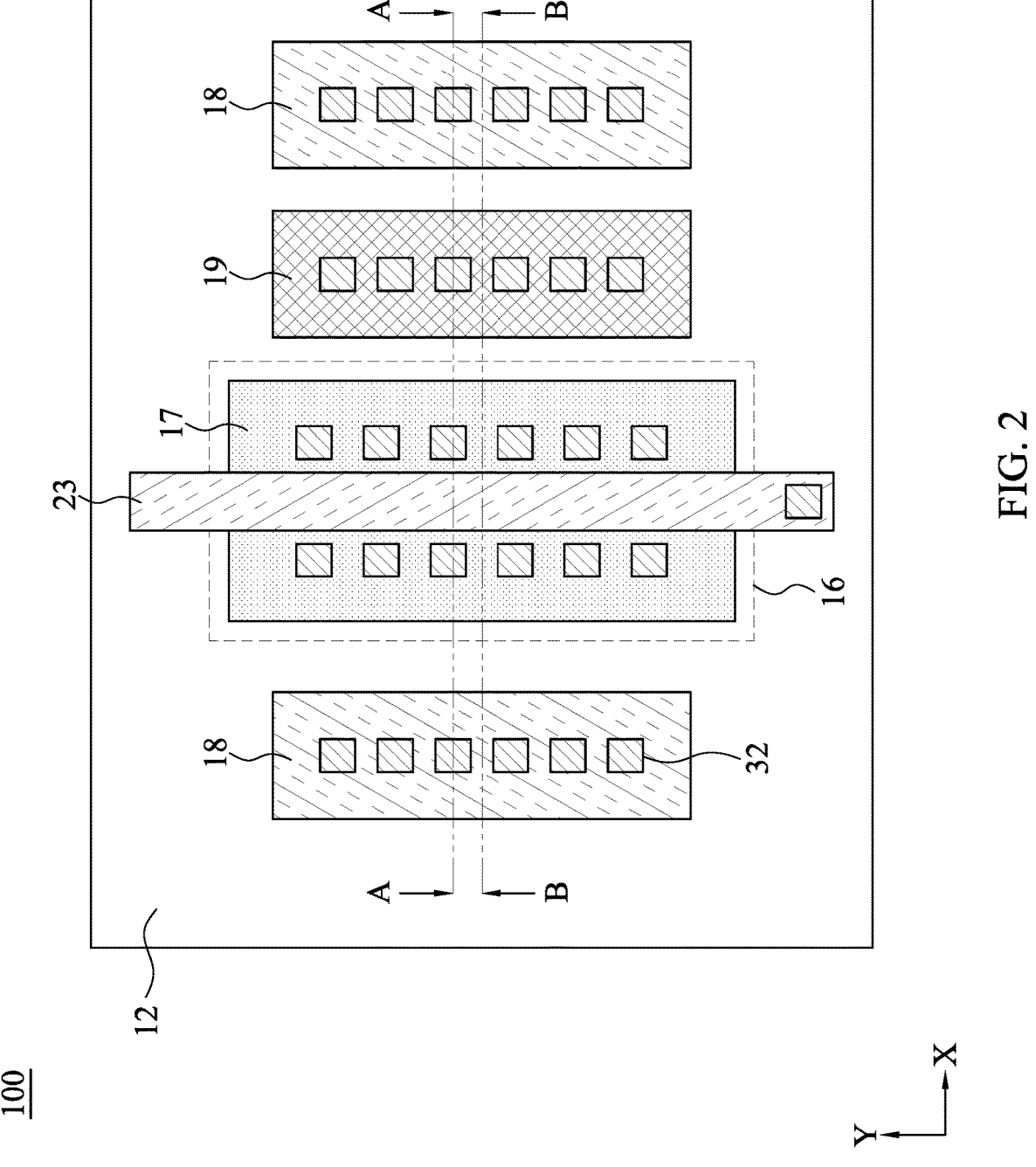
FIG. 2 is a schematic top-view perspective of a semiconductor structure in accordance with some embodiments of the disclosure.

FIG. 2 is a schematic top-view perspective of the semiconductor structure 100 in accordance with some embodiments of the present disclosure, wherein FIG. 1 is a schematic cross section along a line B-B' shown in FIG. 2. As shown in FIGS. 1 and 2, the upper electrode 23 overlaps the lower electrode 17 from the top view perspective. In some embodiments, the upper electrode 23 overlaps a portion of the lower electrode 17. In some embodiments, the upper electrode 23 and the lower electrode 17 extend along a Y direction (a vertical direction of FIG. 2) from the top view perspective of the semiconductor structure 100. In some embodiments, the upper electrode 23 is disposed at a central portion of the lower electrode 17 from the top view perspective. The lower electrode 17 may be formed by implanting an N-type dopant such as As at a concentration of between 1E17 atoms/cm³ and 8E17 atoms/cm³. In some embodiments, a thickness 173 of the lower electrode 17 is in a range of 0.02 to 0.2 microns (μm), wherein the thickness 173 is measured from the first surface 101 to a bottom 172 of the lower electrode 17. In some embodiments, an average depth (Rp) of dopants of the lower electrode 17 in the substrate 10 is in a range of 0.01 to 0.1 μm from the first surface 101 of the substrate 10. The Rp of the dopants of the lower electrode 17 may represent a depth of a middle of the lower electrode 17 from the first surface 101 since dopants are usually concentrated at a middle of a doping region due to a property of an implantation. In some embodiments, a variance of the average depths (ΔRp) of the lower electrode 17 is in a range of 0.007 to 0.02 μm. It should be noted that a boundary of a doping region may not be observed as a clear line, and the boundary of the lower electrode 17 shown in the figures is for a purpose of illustration. Therefore, the bottom 172 may represent a lowest point or a lowest portion of the lower electrode 17.

The dielectric layer 22 is disposed between the upper electrode 23 and the lower electrode 17. In some embodiments, the dielectric layer 22 is at the first surface 101 of the substrate 10 and in contact with the lower electrode 17. In some embodiments, the dielectric layer 22 is overlapped by the upper electrode 23 and covers the central portion of the lower electrode 17 as shown in FIGS. 1 and 2. In some embodiments, the upper electrode 23 covers an entirety of the dielectric layer 22, and the dielectric layer 22 overlaps an entirety of the upper electrode 23. The dielectric layer 22 can be a single layer or a multilayer structure depending on different applications. A material of the dielectric layer 22 can include silicon oxide, silicon nitride, silicon oxynitride, a low-k dielectric material, a high-k dielectric material, combinations thereof, and/or other suitable materials.

The semiconductor structure 100 may further include an isolation 12 formed in the substrate 10. In some embodiments, the isolations 12 include different portions (e.g. 12a, 12b 12c and 12d) from the cross section of FIG. 1. In some embodiment, the portions 12a, 12b, 12c and 12d of the isolation 12 are all connected from the top view perspective as shown in FIG. 2. In some embodiments, from a top view perspective, the isolation 12 surrounds the capacitor 20. In some embodiments, a depth 123 of the isolation 12 is in a range of 0.2 to 0.45 μm from the first surface 101 of the substrate 10. The depth 123 of the isolation 12 is greater than the thickness 173 of the lower electrode 17 so as to prevent lateral leakage from the lower electrode 17. In some embodiments, the isolation 12 (e.g. the portions 12b and 12c) defines a width 174 of the lower electrode 17 as shown in FIG. 1 and/or a coverage area of the lower electrode 17 as shown in FIG. 2. In other words, a distance 126a between the portions 12b and 12c of the isolation 12 is substantially equal to a width (or a length) 174 of the lower electrode 17.

The substrate 10 may further include multiple doping regions or well regions (e.g., 13, 14, 15, 16, 18 and 19) for different purposes, such as measurement, leakage prevention, and adjustment of breakdown voltage. Conductivity types of different doping regions/well regions depend on the conductivity type of the MOS capacitor to be formed. For a purpose of illustration, an N-type MOS capacitor 20 is used as an exemplary embodiment to illustrate the present invention and the figures. For instance, the substrate 10 may include a deep N well (DNW) region 13, a P well (PW) region 14, an N well (NW) region 15, and an extra P well (PW) region 16 as shown in FIG. 1 for a purpose of leakage prevention. For another instance, the substrate 10 may further include a heavily doped P-type (P+) region 19 for a purpose of measurement and one or multiple heavily doped N-type (N+) region(s) 18 for a purpose of adjustment of breakdown voltage. It should be noted that the conductivity types of the doping regions/well regions are provided in the names of the elements 13, 14, 15, 16, 18 and 19 in the following description as the exemplary embodiment of the N-type MOS capacitor 20. However, such description is not intended to limit the present disclosure. In other embodiments, where the capacitor is a P-type MOS capacitor, the conductivity types of the elements 13, 14, 15, 16, 18 and 19 are opposite to those in the illustration below.

As shown in FIG. 1, the DNW region 13 is disposed in the substrate 10 and separated from the first surface 101. In some embodiments, the DNW region 13 extends from a depth 103 in a range of 0.04 to 1 microns (μm) toward a second surface 102 of the substrate 10 opposite to the first surface 101, wherein the depth 103 is measured from the first surface 101 of the substrate 10. The DNW region 13 may be formed by implanting an N-type dopant, such as phosphorus (P), at a concentration of between $200^{13}$ atoms/cm$^3$ and $300^{13}$ atoms/cm$^3$. In some embodiments, an average depth (Rp) of dopants of the DNW region 13 in the substrate 10 is in a range of 1.5 to 2.5 μm from the first surface 101 of the substrate 10. The Rp of the dopants of the DNW region 13 may represent a depth of a middle of the DNW region 13 from the first surface 101. In some embodiments, a variance of the average depths (ΔRp) of the DNW region 13 is in a range of 0.2 to 0.4 μm. In some embodiments, the DNW region 13 stops at the second surface 102.

Still referring to FIG. 1, the NW region 15 is disposed in the substrate 10 over the DNW region 13. In some embodiments, the NW region 15 extends from the first surface 101 toward the DNW region 13. In some embodiments, the NW region 15 is disposed entirely at a portion of the substrate above the DNW region 13. The NW region 15 may be formed by implanting an N-type dopant, such as phosphorus (P), at a concentration of between 1E14 atoms/cm$^3$ and 1E16 atoms/cm$^3$. In some embodiments, an average depth (Rp) of dopants of the NW region 15 in the substrate 10 is in a range of 0.2 to 0.5 μm from the first surface 101 of the substrate 10. The Rp of the dopants of the NW region 15 may represent a depth of a middle of the NW region 15 from the first surface 101. In some embodiments, a variance of the average depths (ΔRp) of the NW region 15 is in a range of 0.04 to 0.1 μm. In some embodiments, the NW region 15 contacts or overlaps the DNW region 13.

The PW region 14 is disposed over the DNW region 13 and in the NW region 15. In some embodiments, the PW region 14 extends from the first surface 101 toward the DNW region 13. In some embodiments, a depth 143 of a bottom 142 of the PW region 14 from the first surface 101 may be in a range of 0.06 to 0.1 μm. In some embodiments, the PW region 14 contacts or overlaps the DNW region 13. The PW region 14 may be formed by implanting a P-type dopant, such as boron (B), at a concentration of between 1E14 atoms/cm$^3$ and 5E15 atoms/cm$^3$, in some embodiments, an average depth (Rp) of dopants of the PW region 14 in the substrate 10 is in a range of 0.03 to 0.5 μm from the first surface 101 of the substrate 10. The Rp of the dopants of the PW region 14 may represent a depth of a middle of the PW region 14 from the first surface 101. In some embodiments, a variance of the average depths (ΔRp) of the PW region 14 is in a range of 0.04 to 0.1 μm.

Still referring to FIGS. 1 and 2, in some embodiments, a portion of the PW region 14 is below the isolation 12. In some embodiments, a portion of the PW region 14 is separated from the first surface 101 by the first portion 12b of the isolation 12 as shown in FIG. 1. In some embodiments, the portion 12c of the isolation 12 is disposed between the lower electrode 17 and a vertical portion of the PW region 14. More specifically, the portion 12c of the isolation 12 is disposed between the lower electrode 17 and the vertical portion of the PW region 14 along a horizontal direction or a direction X of FIG. 1. In some embodiments, the vertical portion of the PW region 14 is sandwiched between the second portion 122a of the isolation 12a and the isolation 12b.

The extra PW region 16 is disposed over the DNW region 13 and in the PW region 15. In some embodiments, the extra PW region 16 extends between the lower electrode 17 and the DNW region 13. In some embodiments, the extra PW region 16 contacts or overlaps a lower portion or the bottom 172 of the lower electrode 17. In some embodiments, the extra PW region 16 contacts or overlaps an upper portion or a top of the DNW region 13. A doping concentration of the extra PW region 16 is greater than the doping concentration of the PW region 14 to prevent vertical leakage from the lower electrode 17 to the DNW region 13. The PW region 14 may be formed by implanting a P-type dopant, such as boron (B), at a concentration of between 3E14 atoms/cm$^3$ and 1E15 atoms/cm$^3$. In some embodiments, an average depth (Rp) of dopants of the extra PW region 16 in the substrate 10 is in a range of 0.2 to 0.5 μm from the first surface 101 of the substrate 10. The Rp of the dopants of the extra PW region 16 may represent a depth of a middle of the extra PW region 16 from the first surface 101. In some embodiments, a variance of the average depths (ΔRp) of the extra PW region 16 is in a range of 0.04 to 0.1 μm.

For a purpose of leakage prevention, a width 164 of the extra PW region 16 may be substantially equal to or greater than the width 174 of the lower electrode 17. In some embodiments, the extra PW region 16 contacts an entirety of the bottom 172 of the lower electrode 17. In some embodiments, the extra PW region 16 covers a lower corner 175 of the lower electrode 17 for a purpose of better prevention of lateral leakage. In some embodiments, the extra PW region 16 covers a lower corner 125 of the portion 12b of the isolation 12 proximal to the lower electrode 17. In some embodiments, the extra PW region 16 overlaps an entirety of the lower electrode 17 from a top view perspective, as shown in FIG. 2. In some embodiments, the entirety of the lower electrode 17 is within a coverage area of the extra PW region 16.

The P+ region 19 extends from the first surface 101 and is disposed in the PW region 14. In some embodiments, the P+ region 19 is horizontally (or laterally) adjacent to the lower electrode 17. In some embodiments, the P+ region 19 is disposed in the vertical portion of the PW region 14. In some embodiments, the P+ region 19 is disposed between the isolations 12a and 12b. In some embodiments, a thickness 193 of the P+ region 19 from the first surface 101 is less than the thickness 173 of the lower electrode 17. A doping concentration of the P+ region 19 is greater than the doping concentration of the PW region 14. In some embodiments, the P+ region 19 is for a purpose of measurement and examination of the capacitor 20 (e.g. the P+ region 19 may function as a contact region for measurement of current or leakage to the lower electrode 17), and function and performance of the semiconductor structure 100 is not affected by an absence of the P+ region 19. In some embodiments, a measurement is provided after formation of the semiconductor structure 100, and a current between the lower electrode 17 and the P+ region 19 is measured. As illustrated above, the P+ region 19 is optionally formed in the substrate 10. The drawings and descriptions above are for a purpose of illustration, and are not intended to limit the present disclosure.

In some embodiments, two N+ regions 18 individually extend from the first surface 101 and at two lateral sides the capacitor 20 as shown in FIGS. 1 and 2. In some embodiments, the N+ region 18 are disposed between or defined by the different portions of the isolation 12. In some embodiments, the N+ region 18 is in a ring shape surrounding the capacitor 20 and the P+ region 19 from the top view perspective (not shown). The N+ region 18 may function as a pickup ring (and may be referred to as a pickup ring 18) for a purpose of adjustment of breakdown voltage. A thickness 183 of the N+ region 18 from the first surface 101 is substantially equal to the thickness 193 of the P+ region 19. In other words, the thickness 183 is less than the depth 123 of the isolation 12 and/or the thickness 173 of the lower electrode 17. A doping concentration of the N+ region 18 is substantially greater than the doping concentration of the NW region 15. In some embodiments, the doping concentration of the N+ region 18 is substantially greater than the doping concentration of the lower electrode 17.

As a result of ongoing reductions in size of semiconductor products, current leakage frequently occurs in newer generations of devices (e.g., those of smaller sizes). For instance, an analog device is sensitive to noise signals, especially those of high frequency. To mitigate the noise signal issue, the MOS capacitor of the present disclosure is connected in parallel to a transistor or a circuit of the analog device to filter the noise signals. A traditional MOS capacitor can provide a similar function of noise filtration; however, an issue of current leakage arises after formation of the traditional MOS capacitor or after extensive product use. Improvements on product performance and product lifetime are desired.

The present disclosure provides a MOS capacitor including improved features to mitigate current leakage and thereby provides improved product performance. The MOS capacitor of the present disclosure can be applied in an analog device or an analog-to-digital device, and a longer product lifetime and a better product performance are observed. The MOS capacitor of the present disclosure can provide a solution to the above illustrated issue.

A lower electrode of the MOS capacitor of the present invention includes heavy dopants (e.g. As), and thus a profile of the lower electrode remains substantially consistent prior to and after one or more annealing operations. In a traditional semiconductor device, diffusion of dopants of a doping region occurs during a thermal annealing operation. A profile of the doping region is thus changed or expanded after the thermal annealing operation, which results in an increased current leakage. The current leakage affects product performance and may result in a lower product yield. The present disclosure provides a MOS capacitor having a consistent profile of a doping region during a manufacturing process, and thus the issue of current leakage due to the changed profile of the doping region can be avoided. In addition, presence of an extra doping region having a conductivity type different from that of the lower electrode can further prevent current leakage toward a bottom of a substrate. An increased depth of an isolation adjacent to the lower electrode can also lead to improved prevention of lateral leakage.

A method of manufacturing a semiconductor structure similar to the semiconductor structure 100 is also provided in the disclosure. In order to further illustrate concepts of the present disclosure, various embodiments are provided below. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

FIG. 3 is a flow diagram of a method 600 for manufacturing a semiconductor structure in accordance with some embodiments of the present disclosure. The method 600 includes a number of operations (601, 602, 603, 604, 605 and 606) and the description and illustration are not deemed as a limitation to the sequence of the operations. In the operation 601, a substrate including an isolation is provided or received. In the operation 602, a mask layer exposing a portion of the substrate between portions of the isolation is formed. In the operation 603, a first implantation is performed to form a first doping region at the portion of the substrate, wherein the first implantation includes P-type dopant. In the operation 604, a second implantation is performed to form a second doping region at the portion of the substrate over the first doping region, wherein the second implantation includes arsenic. In the operation 605, the mask layer is removed after the second implantation. In the operation 606, a first gate structure is formed over the portion of the substrate. It should be noted that the operations of the method 600 may be rearranged or otherwise modified within the scope of the various aspects. Additional processes may be provided before, during, and after the method 600, and some other processes may be only briefly described herein. Thus, other implementations are possible within the scope of the various aspects described herein.

Figure 4:
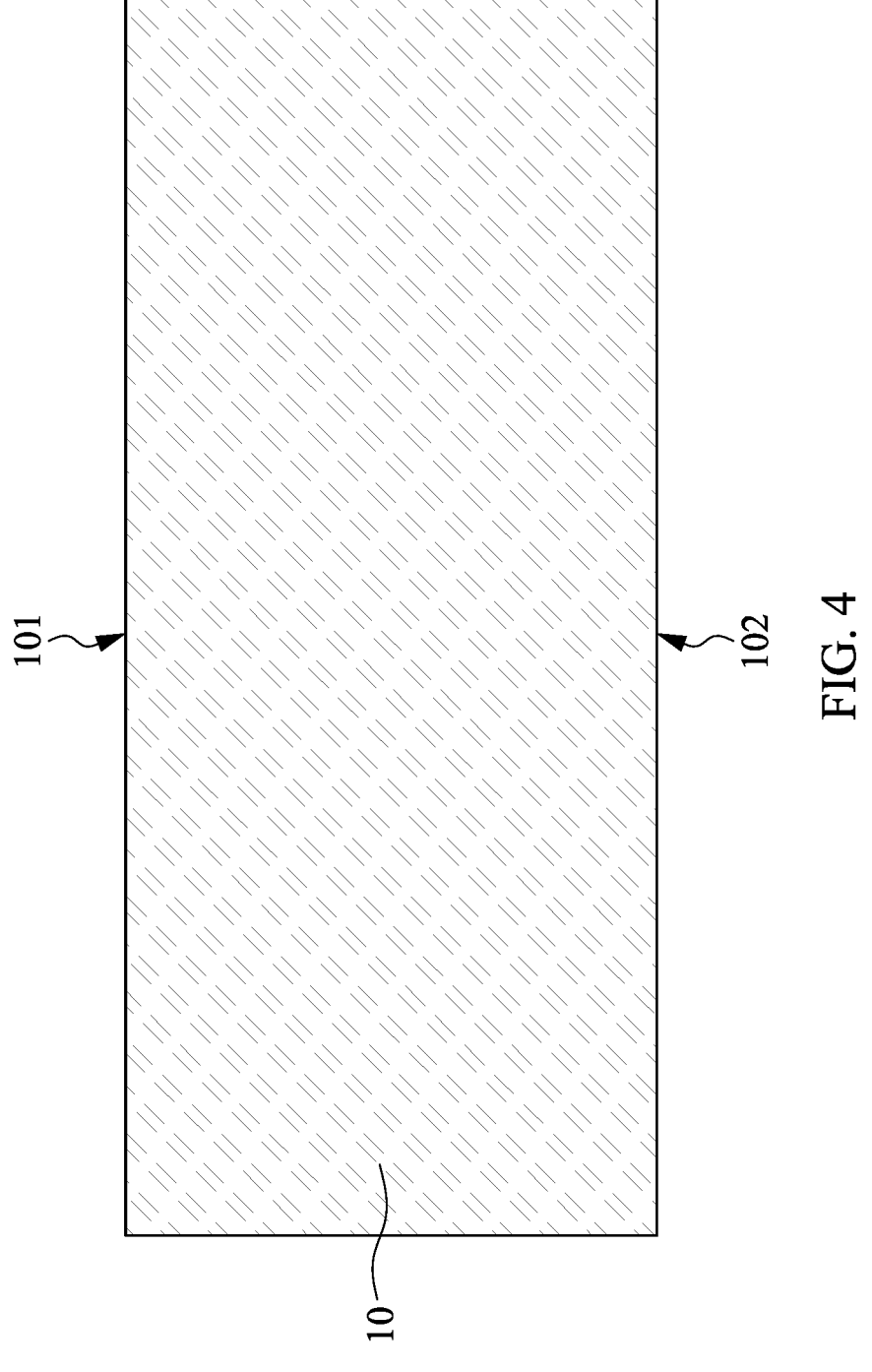
FIGS. 4 to 16 are schematic cross-sectional diagrams of a semiconductor structure at different stages of a manufacturing method in accordance with some embodiments of the disclosure.

Referring to FIG. 4, which is a schematic cross-sectional diagram of a semiconductor structure along the line A-A' in FIG. 2 at a stage of the method 600 in accordance with some embodiments of the present disclosure. In the operation 601, a substrate 10 is formed, provided or received. In some embodiments, the substrate 10 includes semiconductive material, such as silicon. In some embodiments, the substrate 10 is a bulk substrate. In some embodiments, the substrate 10 include silicon or germanium in a single crystal form. In some embodiment, the substrate 10 includes other semiconductor materials, such as silicon germanium, silicon carbide, gallium arsenide, or the like. Alternatively, the semiconductor layer 13 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In some embodiments, the substrate 10 is a multilayer structure, or includes a multilayer compound semiconductor structure. In some embodiments, the substrate 10 is a semiconductor-on-insulator (SOI) substrate. The substrate 10 may include a first surface 101 and a second surface 102 opposite to the first surface 101.

Figure 5:
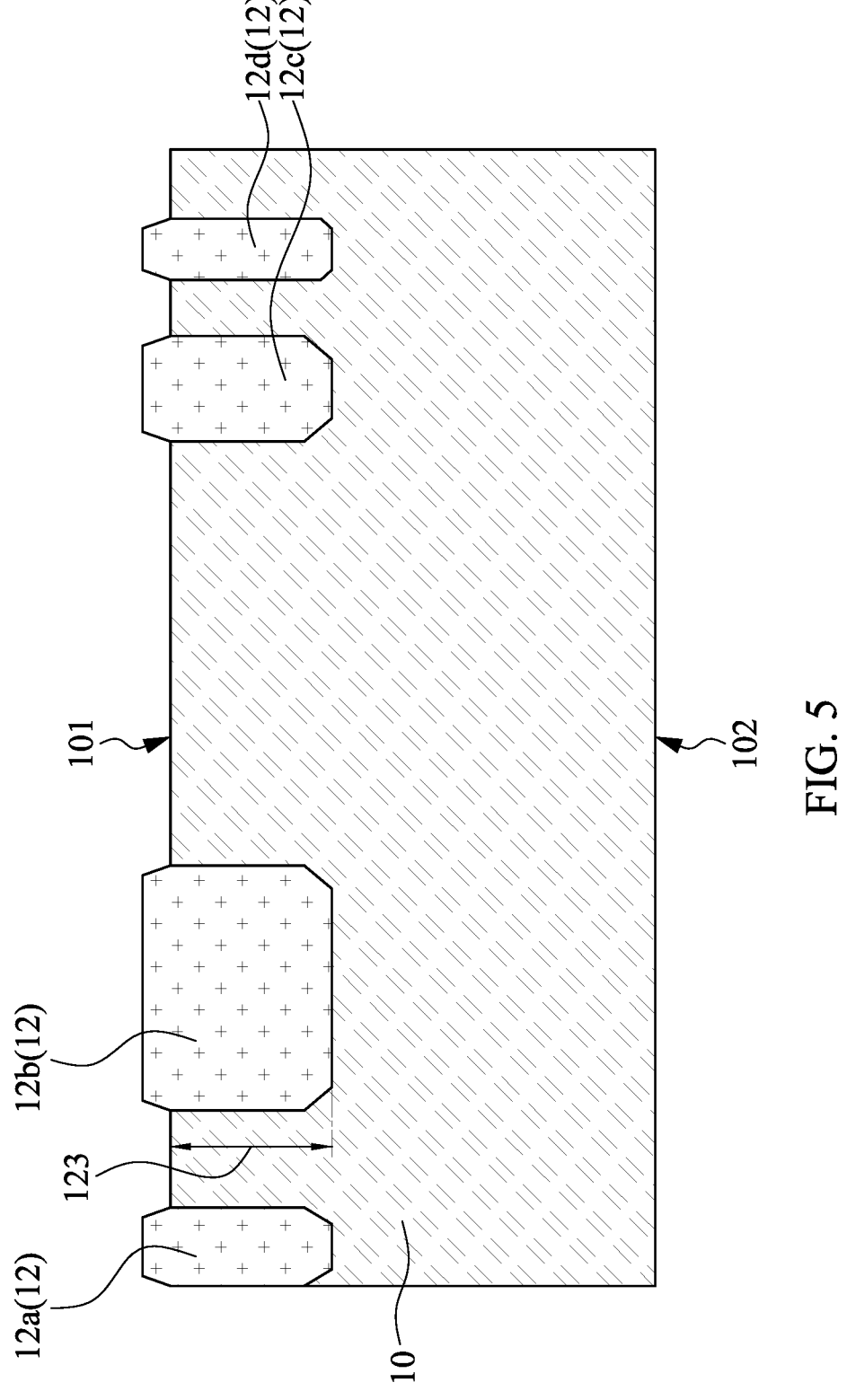

Referring to FIG. 5, which is a schematic cross-sectional diagram of a semiconductor structure along a line A-A in FIG. 2 at a stage of the method 600 in accordance with some embodiments of the present disclosure. In the operation 601, after the substrate 10 is provided, an isolation 12 is formed in the substrate 10. The isolation 12 extend from the first surface 101 toward the second surface 102 of the substrate 10 and stops at a depth 123 from the first surface 101. In some embodiments, the depth 123 of the isolation 12 is in a range of 0.2 to 0.45 μm from the first surface 101 of the substrate 10. It should be noted that only a portion of the substrate 10 is depicted in the figures, and the method 600 can be integrated with conventional processing of formation of other electrical components, e.g., transistors, in other portions of the substrate 10. In some embodiments, the isolation 12 is formed concurrently with other isolations in other portions of the substrate 10, and depths of the isolation 12 and other isolations in other portions are consistent across the substrate 10. In some embodiments, the isolation 12 are formed prior to or after those isolations in the active region or other regions, and the depth 123 may be different from depths of other isolations in other portions of the substrate 10. The isolation 12 can be formed by a conventional method, and a configuration of the isolation 12 is not limited herein.

For instance, an etching operation may be performed on the first surface 101 to remove portions of the substrate 10, and a deposition can be performed to form the isolation 12.

In some embodiments, the deposition operation includes a chemical vapor deposition (CND), a physical vapor deposition (PVI)), a liquid-phase deposition (LPD), an atmospheric-pressure CVD (APCVD), an atomic layer deposition (ALD), a sub-atmospheric CVD (SACVD), a low-pressure chemical vapor deposition (LPCVD), a plasma-enhanced CVD (PECVD), or a combination thereof. In some embodiments, the isolation 12 include dielectric material. In some embodiments, the isolation 12 include silicon oxide, silicon nitride, silicon oxy-nitride, a low-k dielectric material, a high-k dielectric material, combinations thereof, and/or other suitable dielectric materials.

In some embodiments, the isolation 12 protrudes from the first surface 101 as shown in FIG. 5. In some embodiments, the isolation 12 is substantially coplanar with the first surface 101 of the substrate 10. A width of different portions (e.g. 12a, 12b, 12c and 12d) of the isolation 12 or a distance between adjacent portions of the isolation 12 can be adjusted according to different applications.

Figure 6:
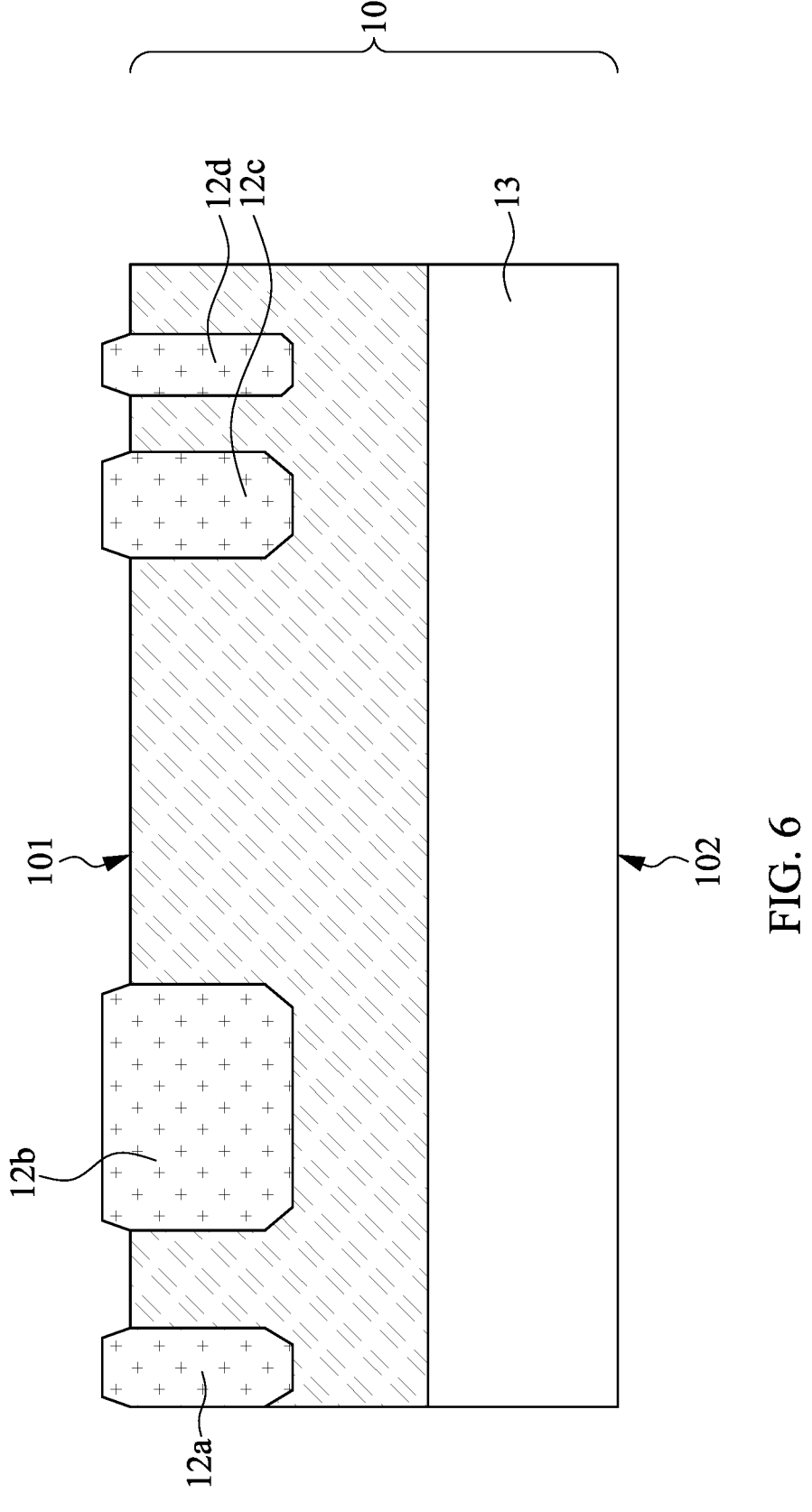

Referring to FIG. 6, which is a schematic cross-sectional diagram of a semiconductor structure along the line A-A' in FIG. 2 at a stage of the method 600 in accordance with some embodiments of the present disclosure. After the formation of the isolation 12, a DNW region 13 is formed in the substrate 10. The DNW region 13 can be formed by an implantation to introduce N-type dopants into the substrate 10. It should be noted that a conductivity type described herein is for a purpose of illustration, but not intended to limit the present disclosure. In some embodiments, the DNW region 13 contacts the second surface 102 of the substrate 10 as shown in FIG. 6. In some embodiments, an entirety of the DNW region 13 is disposed within the substrate 10 and separated from both the first surface 101 and the second surface 102. In some embodiments, a photoresist layer is formed over the first surface 101 to define the DNW region 13 (not shown). In some embodiments, pre-cleaning, photoresist application (formation of the photoresist layer), exposure, developing and the implantation are sequentially performed to form the DNW region 13.

Figure 7:
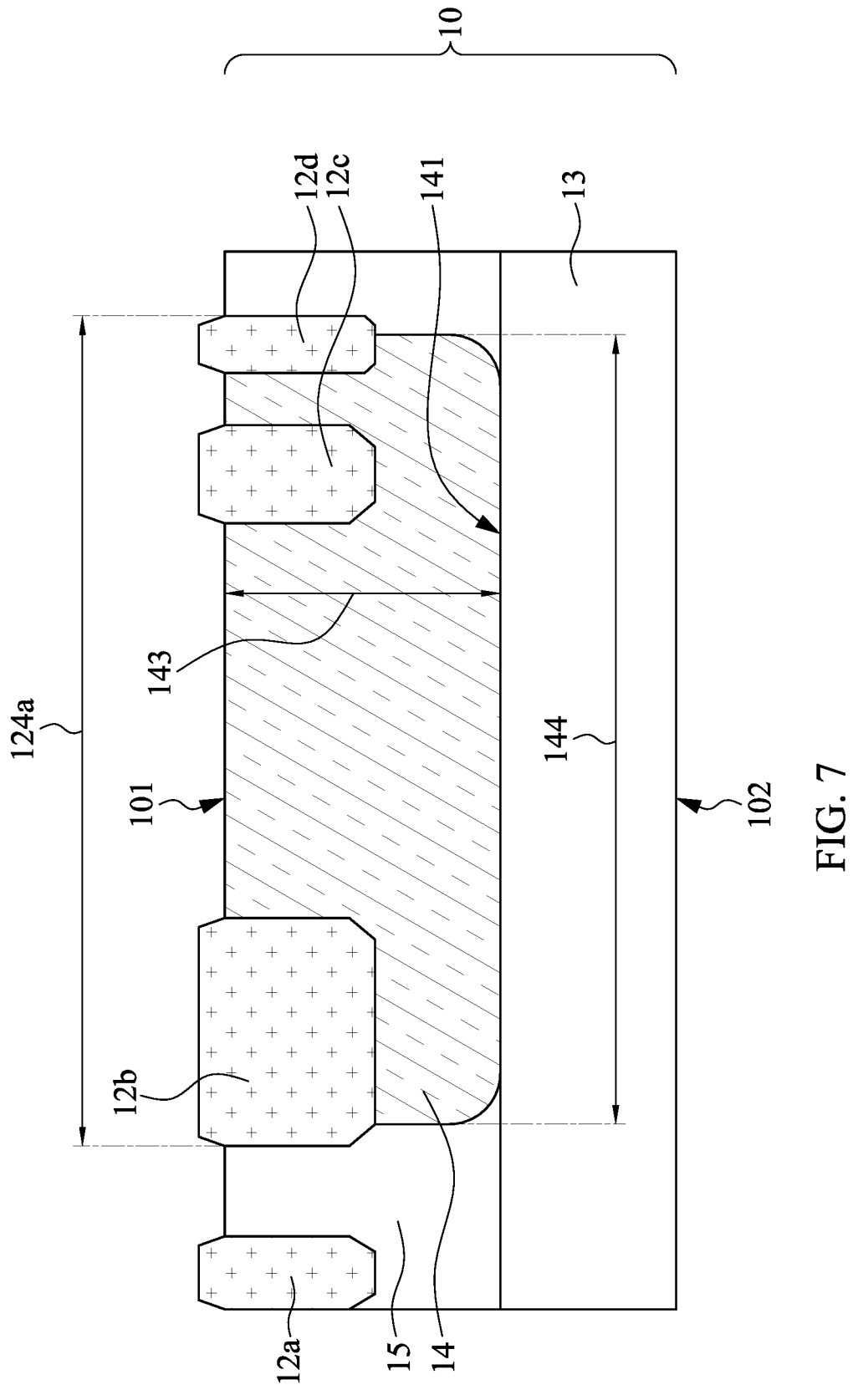

Referring to FIG. 7, which is a schematic cross-sectional diagram of a semiconductor structure along the line A-A' in FIG. 2 at a stage of the method 600 in accordance with some embodiments of the present disclosure. After the formation of the DNW region 13, an NW region 15 and a PW region 14 are defined in the substrate 10 above the DNW region 13. A sequence of implantations may be performed to form the NW region and the PW region 14. In some embodiments, the NW region 15 is formed prior to the forming of the PW region 14. In some embodiments, an implantation of N-type dopants is performed on the first surface 101 of the substrate 10 to form the NW region 15, and then an implantation of P-type dopants is performed on the first surface 101 of the substrate 10 to form the PW region 14 in the NW region 15. In other embodiments, the NW region 15 is formed after the forming of the PW region 14, and similar processing can be provided but with a reversed sequence of implantations. In some embodiments, a distance 124a of the isolation 12 is substantially greater than a width 144 of the PW region 14, wherein the distance 124a is measured between two opposite outer sidewalls of the portions 12b and 12d of the isolation 12 on a cross section (e.g., the cross section as shown in FIG. 7), and the width 144 is measured between two opposite edges of the same cross section. A depth 143, a doping concentration, and detailed description of positions relative to other elements of the PW region 14 are as illustrated above, and repeated description is omitted herein. Similarly, detailed description of other elements illustrated in previous paragraphs is omitted in the following specification for a purpose of brevity; however, such omission is not intended limit the present disclosure.

Figure 8:
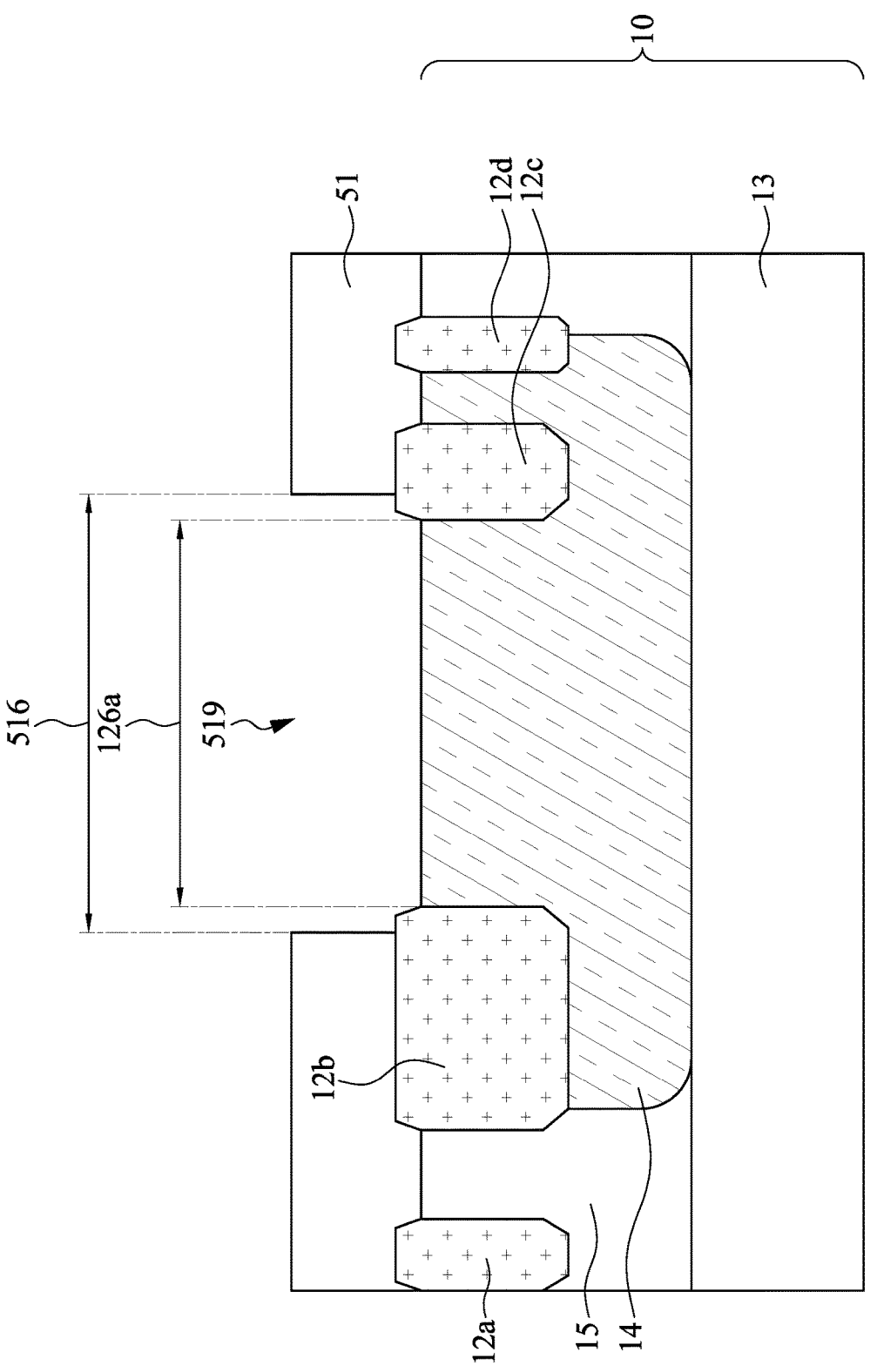

Referring to FIG. 8, which is a schematic cross-sectional diagram of a semiconductor structure along the line A-A' in FIG. 2 at a stage of the method 600 in accordance with some embodiments of the present disclosure. In the operation 602, a mask layer 51 is formed over the first surface 101 of the substrate 10. The mask layer 51 may include photosensitive material, dielectric material, or hard material. In some embodiments, the mask layer 51 is a photoresist layer. In some embodiments, the mask layer 51 includes a dielectric material different from that of the isolation 12, or having an etching selectivity to that of the isolation 12. In some embodiments, the mask layer 51 includes oxide, nitride, oxynitride, or a combination thereof. The mask layer 51 exposes a portion of the substrate 10 in order to define a region of an extra PW region 16 to be formed in later processing.

In some embodiments, the mask layer 51 includes an opening 519 exposing the portion of the substrate 10 between the portions 12b and 12c of the isolation 12. In some embodiments, a portion of the PW region 14 between the portions 121 and 12c of the isolation 12 is also exposed by the opening 519 of the mask layer 51. In some embodiments, a width 516 of the opening 519 is substantially greater than a distance 126a between the portions 12b and 12c of the isolation 12 shown in FIG. 8. In some embodiments, the mask layer 51 exposes a peripheral portions of the portions 12b and 12c to ensure that dopants of the extra PW region 16 can fill an entirety of a space between the portions 12b and 12c of the isolation 12.

Figure 9:
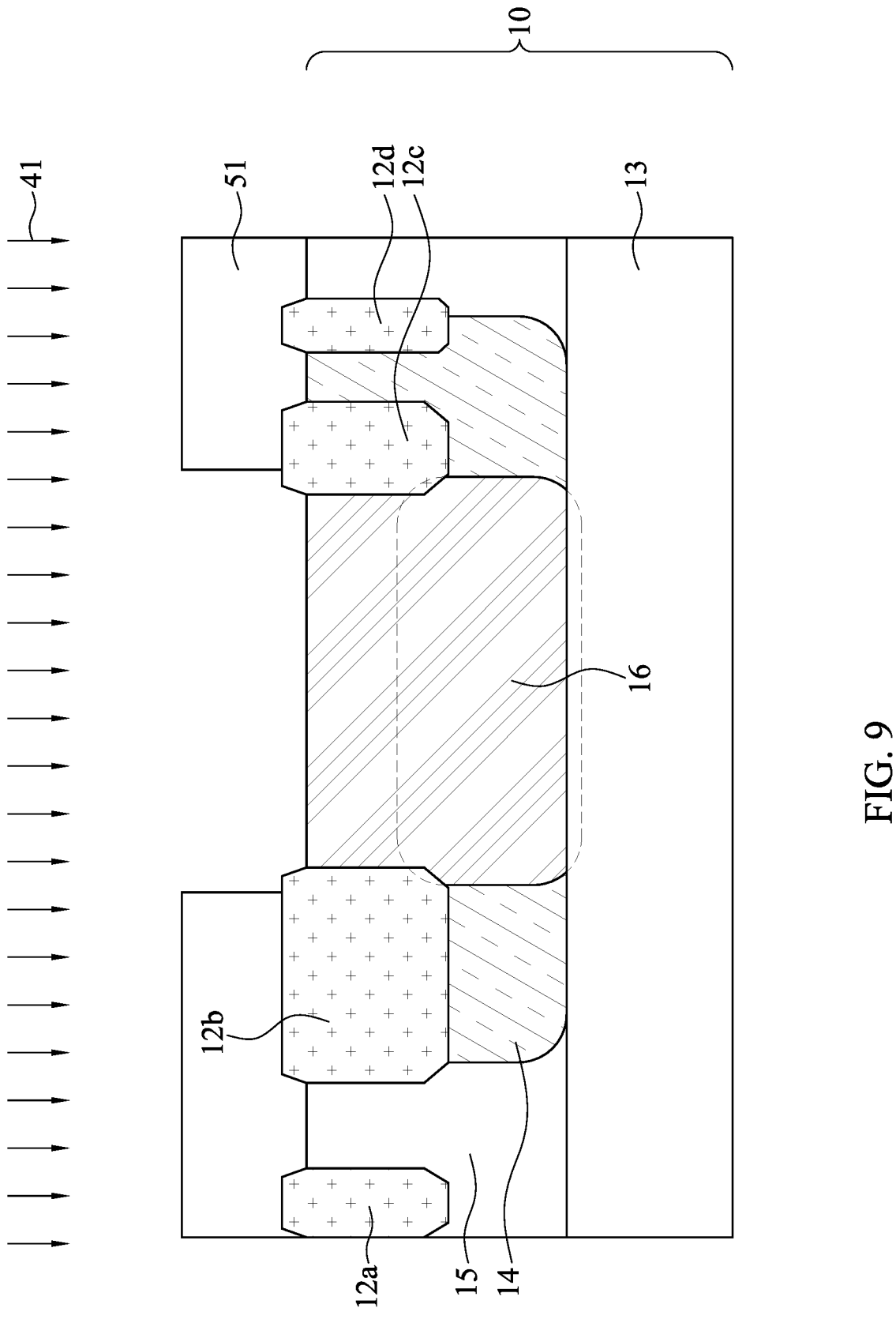

Referring to FIG. 9, which is a schematic cross-sectional diagram of a semiconductor structure along the line A-A' in FIG. 2 at a stage of the method 600 in accordance with some embodiments of the present disclosure. In the operation 603, an implantation 41 is performed on the substrate 10 using the mask layer 51 as a mask to form the extra PW region 16. In some embodiments, an ion or a dopant of the implantation 41 includes a P-type dopant (e.g., boron). It should be noted that the dopants of the extra PW region 16 may travel between the first surface 101 and an upper portion of the DNW region 13. An energy and a dosage of ions of the implantation 41 can be controlled to form the extra PW region 16 having an Rp of dopants in a range of 0.2 to 0.5 μm, which is above the DNW region 13. Thus, the dopants of the extra PW region 16 are mostly disposed in a region overlapping a portion of the DNW region 13, as indicated by a dotted line in FIG. 9. However, for purposes of illustration and ease of understanding, the extra PW region 16 is depicted above the DNW region 13 without the dotted line in some other figures of the application (e.g., FIG. 1). In other embodiments, the extra PW region 16 represents the region indicated within the dotted line in FIG. 9.

Figure 10:
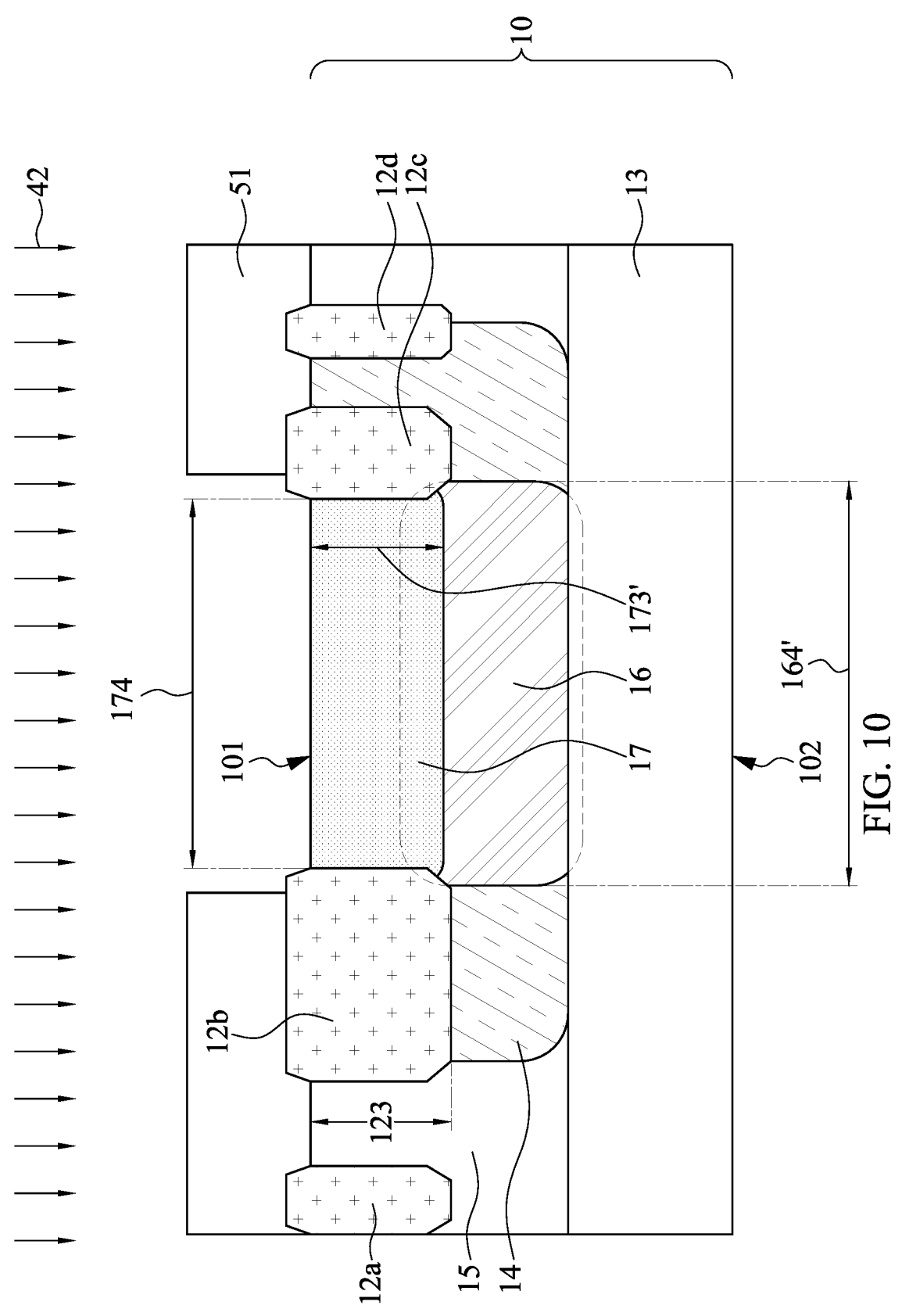

Referring to FIG. 10, which is a schematic cross-sectional diagram of a semiconductor structure along the line A-A' in FIG. 2 at a stage of the method 600 in accordance with some embodiments of the present disclosure. In the operation 604, an implantation 42 is performed on the substrate 10 using the mask layer 51 as a mask to form an N+ well region 17. In some embodiments, an ion or a dopant of the implantation 42 includes arsenic. An ion energy and a dosage of ions of the implantation 42 can be controlled to form the N+ well region 17 having an Rp of dopants in a range of 0.01 to 0.1 μm, which is above the Rp of dopants of the extra PW region 16. In some embodiments, an ion energy of the implantation 41 is greater than an ion energy of the implantation 42. A thickness 173' of the N+ well region 17 is controlled to be substantially equal to or less than the depth 123 of the isolation 12. In some embodiments, the thickness 173' of the N+ well region 17 is less than the depth 123 of the isolation 12 for a purpose of better leakage prevention. In some embodiments, the N+ well region 17 overlaps an upper portion of the region within the dotted line of the extra PW region 16. It should be noted that the N+ well region 17 and the extra PW region 16 are defined by the same mask layer 51, and thus a width 174 of the N+ well region 17 and a width 164' of the extra PW region 16 should be substantially equal; however, because the width 174 is constrained h the isolation 12, the width 174 is in fact substantially less than the width 164' of the extra PW region 16.

Figure 11:
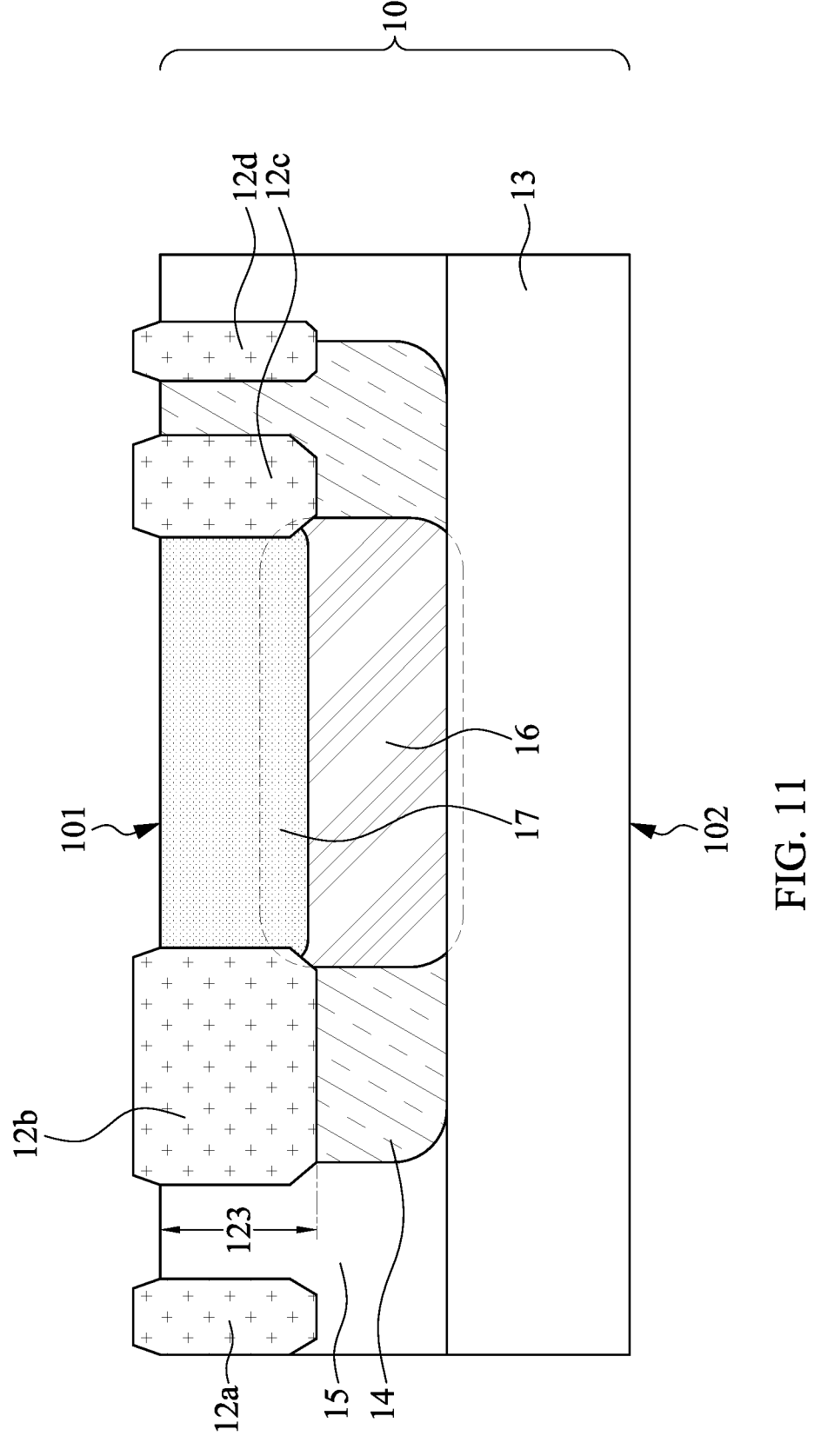

Referring to FIG. 11, which is a schematic cross-sectional diagram of a semiconductor structure along the line A-A' in FIG. 2 at a stage of the method 600 in accordance with some embodiments of the present disclosure. In the operation 605, the mask layer 51 is removed after the implantation 42, i.e., after the formation of the N+ well region 17. In some embodiments, an etching operation is performed to remove the mask layer 51. The etching operation may include a dry etching operation, a wet etching operation, a directional plasma etching operation, or a combination thereof. In some embodiments, a post cleaning operation is performed after the removal of the mask layer 51.

Figure 12:
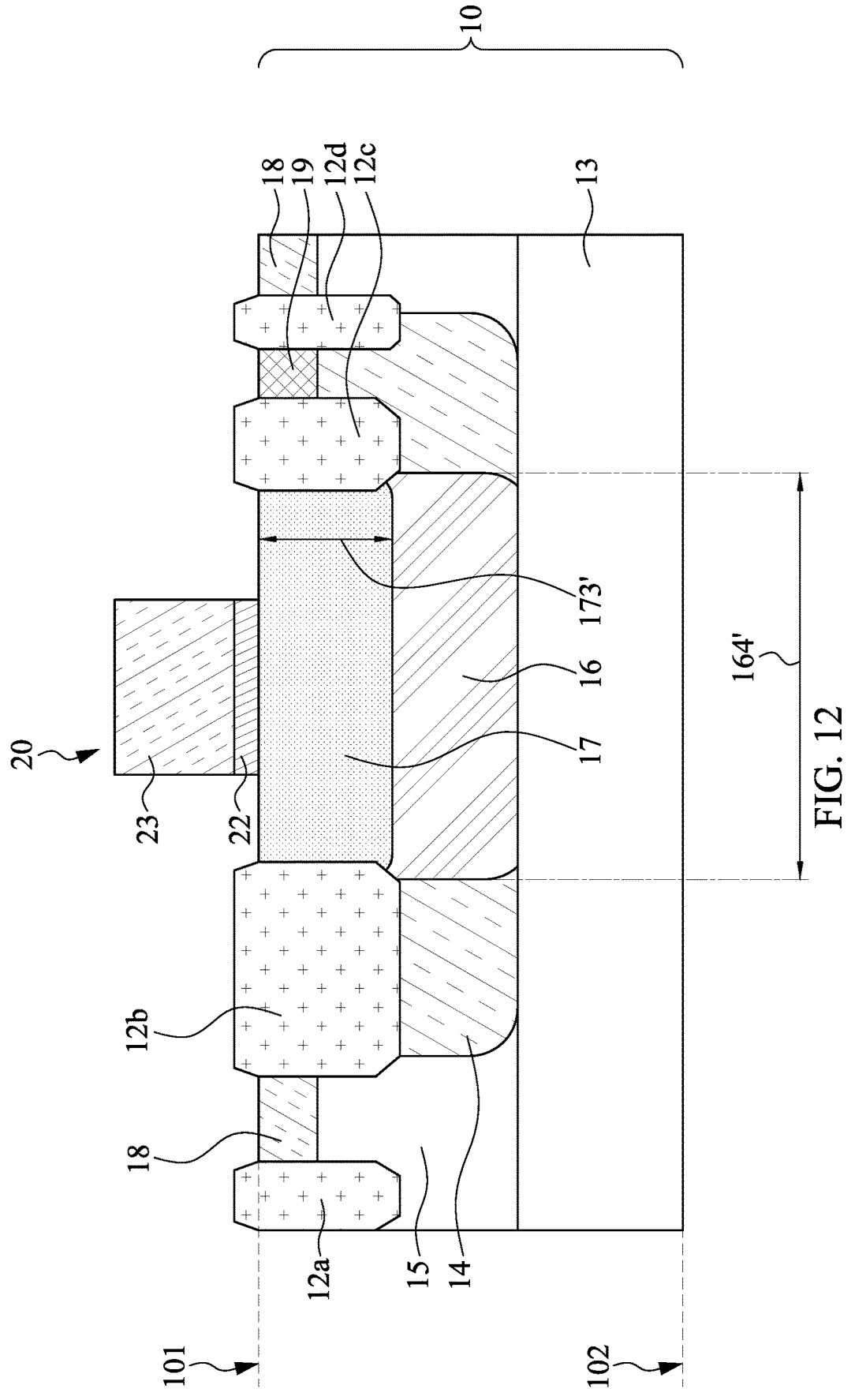

Referring to FIG. 12, which is a schematic cross-sectional diagram of a semiconductor structure along the line A-A' in FIG. 2 at a stage of the method 600 in accordance with some embodiments of the present disclosure. In the operation 606, a dielectric layer 22 and a gate structure 23 are formed on the substrate 10 over the N+ well region 17. A capacitor 20 is thereby formed. The N+ region 17 becomes a lower electrode of the capacitor 20 and the gate structure 23 becomes an upper electrode of the capacitor 20. In some embodiments, the dielectric layer 22 includes oxide. In some embodiments, the dielectric layer 22 is a multilayer structure. In some embodiments, the dielectric layer 22 include silicon oxide, silicon nitride, silicon oxynitride, a low-k dielectric material, a high-k dielectric material, combinations thereof, and/or other suitable materials. In some embodiments, a deposition is performed to form the dielectric layer 22. The gate structure 23 can be a polysilicon gate structure or a metal gate structure, and may include one or more work function layers. In some embodiments, the gate structure 23 is formed concurrently with other transistors formed in other regions of the substrate 10, and a detailed structure of the gate structure 23 is the same as a gate structure of one of the other transistors. A conventional method can be performed to form the dielectric layer 22 and the gate structure 23, and is not limited herein. In an alternative embodiment, formation of a dummy gate structure, removal of the dummy gate structure, and deposition of the metal gate structure are sequentially performed to form the gate structure 23.

In some embodiments, prior to the formation of the dielectric layer 22 and the gate structure 23 in the operation 606, a implantation to form one or multiple N+ regions 18 and a implantation to from a P+ region 19 are performed. The formation of the P+ region 19 can be performed prior to or after the formation of the one or multiple N+ regions 18. In addition, a conventional method can be applied in the formation of the P+ region 19 and/or the formation of the one or multiple N+ regions 18. It is not limited herein.

Figure 13:
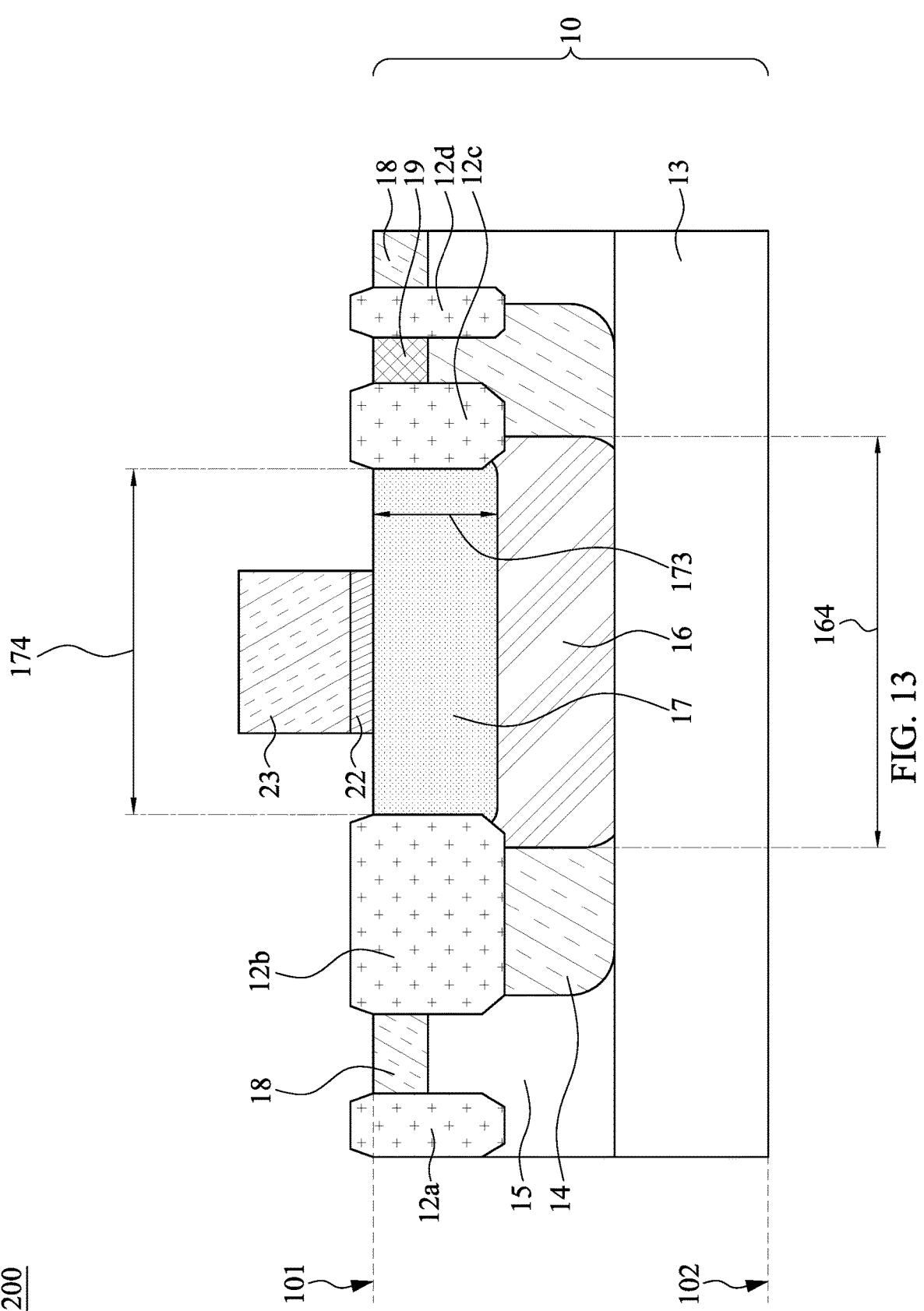

Referring to FIG. 13, which is a schematic cross-sectional diagram of a semiconductor structure along the line A-A' in FIG. 2 at a stage of the method 600 in accordance with some embodiments of the present disclosure. After the operation 606, the method 600 may further include an annealing operation to activate source/drain regions of the transistors formed in other regions of the substrate 10. In some embodiments, the annealing operation includes a thermal annealing. Diffusion of dopants in a doping region occurs during the annealing operation, and expansion of the doping region is observed after the annealing operation. In some embodiments, a width 164 of the extra PW region 16 after the annealing operation is substantially greater than the width 164' before the annealing operation as shown in FIG. 12. In some embodiments, the width 174 of the N+ well region 17 remains substantially consistent during the annealing operation due to the presence of the isolation 12. A thickness 173 of the N+ well region 17 after the annealing operation may be substantially equal to or slightly greater than the thickness 173' before the annealing operation as shown in FIG. 12. Due to a property of the dopant (e.g., As) used in the implantation 42, no diffusion or little diffusion of the dopants of the N+ well region 17 occurs during the annealing operation, and the thickness 173 can be controlled to be substantially equal to or less than the depth 123 of the isolation 12 even after one or more rounds of the annealing operation or after extended usage time. A semiconductor structure 200 similar to the semiconductor structure 100 is thereby formed.

Figure 14:
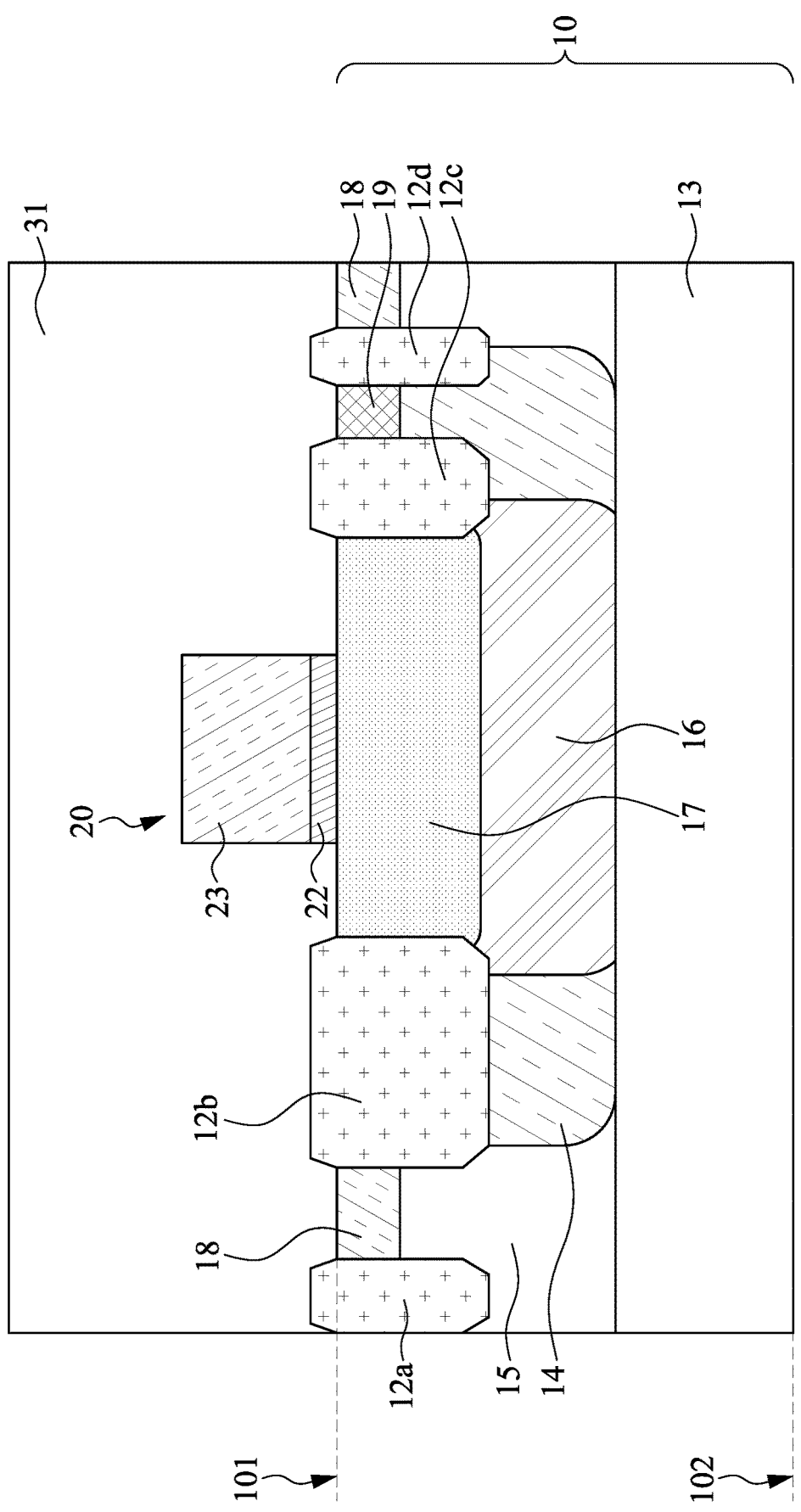
Figure 15:
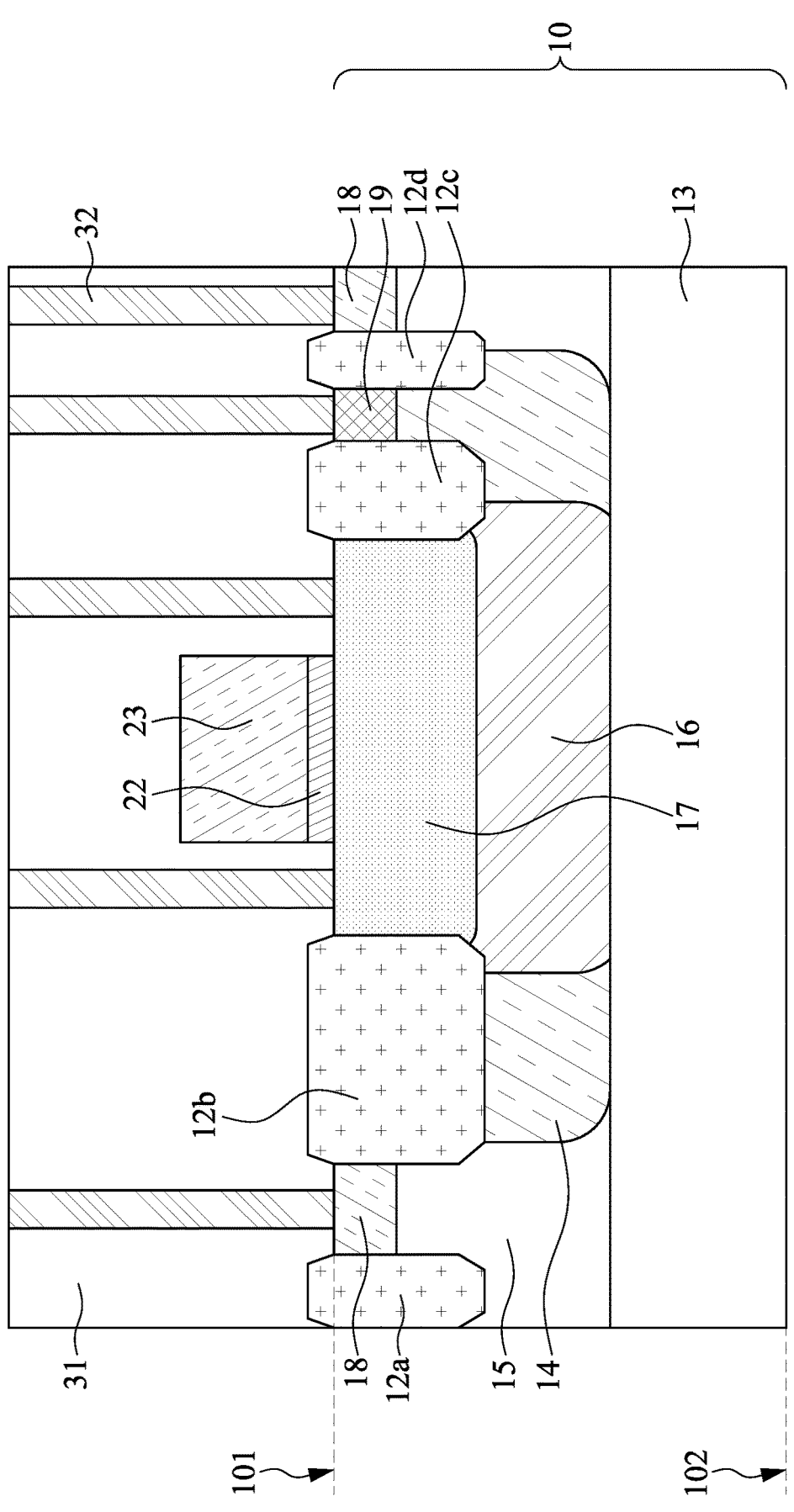
Figure 16:
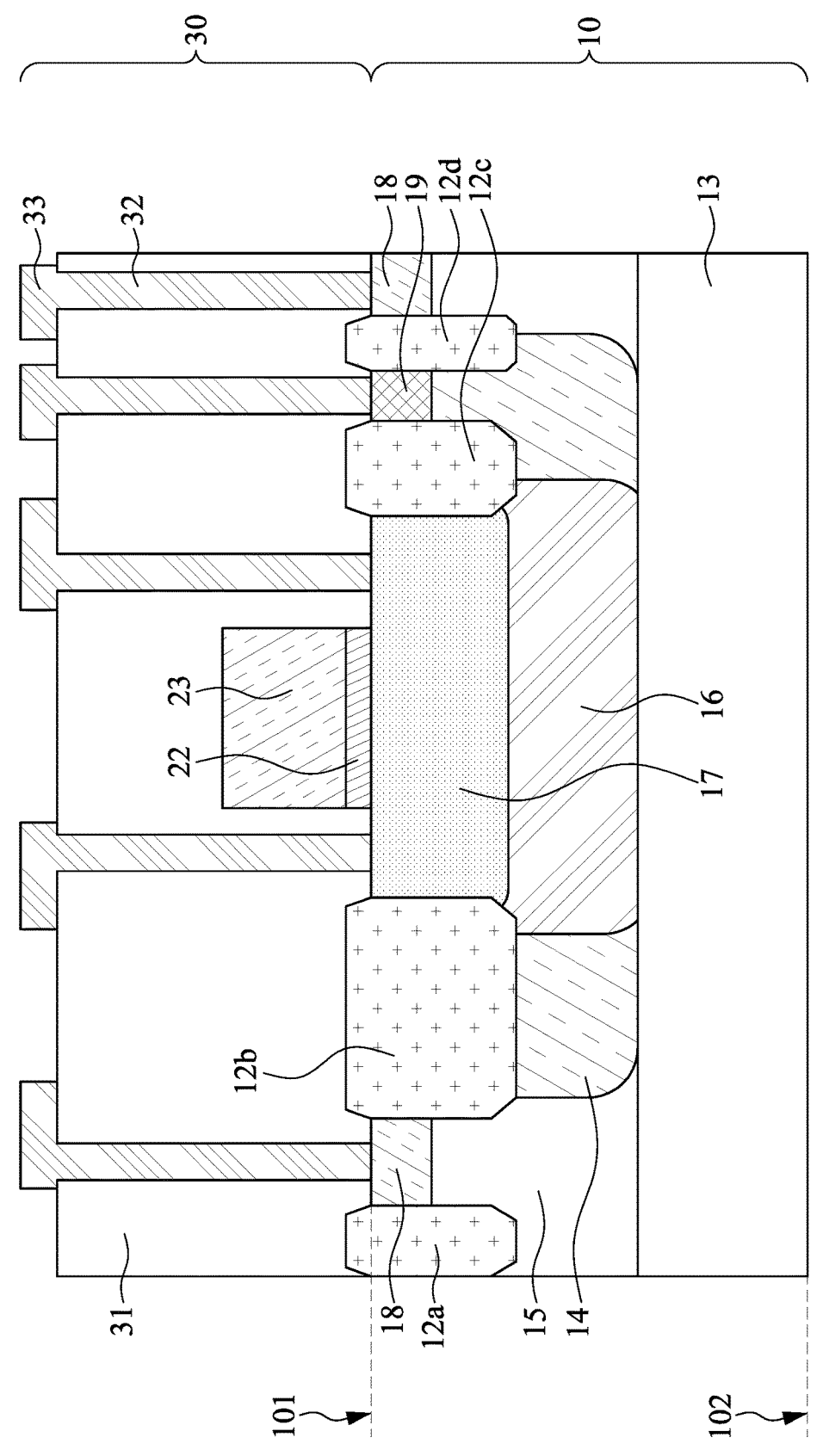

Referring to FIGS. 14 to 16, which are schematic cross-sectional diagrams of a semiconductor structure along the line A-A' in FIG. 2 at different stages of the method 600 in accordance with some embodiments of the present disclosure. After the operation 606, the method 600 may further include operations to form an interconnect structure 30 over the substrate 10 and covering the capacitor 20. In some embodiments, an insulating layer 31 is formed over the first surface 101 of the substrate 10 and covering the gate structure 23 and the dielectric layer 22 of the capacitor 20 as shown in FIG. 14. In some embodiments, the insulating layer 31 includes oxide, nitride, oxy-nitride, a low-k dielectric material, a high-k dielectric material, combinations thereof, and/or other suitable dielectric materials. In some embodiments, multiple conductive vias 32 are formed penetrating the insulating layer 23 as shown in FIG. 15. In some embodiments, at least one of the conductive vias 32 electrically connects to or physically contacts the capacitor 20 (not shown in FIG. 14 but in FIGS. 15 and 16). In some embodiments, one or more of the conductive vias 32 electrically connects to or physically contacts the N+ well region 17 of the capacitor 20. In some embodiments, one of the conductive vias 32 electrically connects to or physically contacts the P+ well region 19. In some embodiments, one or more of the conductive vias 32 electrically connects to or physically contacts the N+ regions 18 of the capacitor 20.

In some embodiments, multiple conductive lines 33 are formed over the insulating layer 31 and electrically connect to the conductive vias 32 as shown in FIG. 16. Formations of the insulating layer 31, the conductive vias 32 and the conductive lines 33 are performed repeatedly, and an interconnect structure 30 is thereby formed. It should be noted that only one layer of the insulating layer 31, the conductive vias 32 and the conductive lines 33 is depicted in FIG. 16 for purposes of illustration and simplicity of the figures. A number of layers of the insulating layer 31, the conductive vias 32 and the conductive lines 33 is not limited herein. A semiconductor structure 300 is thereby formed.

The present disclosure provides a MOS capacitor with improved leakage prevention and a method for forming the same. The forming method of the MOS capacitor can be integrated with a conventional manufacturing method, for example of a transistor or a circuit of an analog device. The MOS capacitor and the method of the present disclosure can be applied in different generations of devices, e.g., N20, N28, N40, N65, etc. Other benefits and advantages of the MOS capacitor of the present disclosure are as described above in previous paragraphs.

In accordance with some embodiments of the disclosure, a semiconductor structure is provided. The semiconductor structure includes a substrate, a first well region, a second well region, an isolation, a gate structure, and a dielectric layer. The first well region is disposed in the substrate and has a first conductivity type, wherein a dopant of the first well region includes arsenic. The second well region is disposed in the substrate under the first well region, wherein the second well region has a second conductivity type different from the first conductivity type. The isolation is disposed in the substrate and surrounds the first well region, wherein a depth of the isolation is substantially greater than or equal to a depth of the first well region from a first surface of the substrate. The gate structure is disposed over the substrate and overlaps the first welt region. The dielectric layer is disposed between the gate structure and the first well region.

In accordance with some embodiments of the disclosure, a semiconductor structure is provided. The semiconductor structure includes a capacitor structure, a first doping region and a second doping region. The capacitor structure is disposed in a substrate and includes: a first electrode, disposed over a first surface of the substrate; a second electrode, disposed at the first surface and comprising a portion of the substrate, wherein the second electrode includes arsenic; and a dielectric layer, disposed on the first surface of the substrate and between the first electrode and the second electrode. The first doping region is disposed in the substrate under the second electrode, and has a conductivity type different from that of the second electrode. The second doping region is disposed in the substrate and surrounds the first doping region and the second electrode, wherein a doping concentration of the first doping region is substantially greater than a doping concentration of the second doping region.

In accordance with some embodiments of the disclosure, a method for manufacturing a semiconductor structure is provided. The method may include several operations. A substrate including an isolation is provided or received. A mask layer exposing a portion of the substrate between portions of the isolation is formed. A first implantation is performed to form a first doping region at the portion of the substrate, wherein the first implantation includes P-type dopant, A second implantation is performed to form a second doping region at the portion of the substrate over the first doping region, wherein the second implantation includes arsenic. The mask layer is removed after the second implantation. A first gate structure is formed over the portion of the substrate.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a first well region, disposed in the substrate and having a first conductivity type, wherein a dopant of the first well region includes arsenic;
a second well region, disposed in the substrate under the first well region, wherein the second well region has a second conductivity type different from the first conductivity type;
an isolation, disposed in the substrate and surrounding the first well region, wherein a depth of the isolation is substantially greater than or equal to a depth of the first well region from a first surface of the substrate;
a gate structure, disposed over the substrate and overlapping the first well region;
a first contact, electrically connected to the gate structure;
a second contact, electrically connected to a portion of the first well region exposed by the gate structure, wherein an arsenic concentration of a first portion of the first well region covered by the gate structure is substantially equal to an arsenic concentration of a second portion of the first well region exposed by the gate structure; and
a third well region, surrounding the second well region and at least a portion of the first well region, wherein the second well region and the third well region have a same conductivity type.

2. The semiconductor structure of claim 1, wherein the first well region has a first width along a first orientation, and the second well region has a second width greater than the first width along the first orientation.

3. The semiconductor structure of claim 1, wherein a doping concentration of the second well region is greater than that of the third well region.

4. The semiconductor structure of claim 1, further comprising:
a fourth well region, surrounding the third well region and the isolation, wherein a conductivity type of the third well region is different from a conductivity type of the fourth well region.

5. The semiconductor structure of claim 1, wherein the second well region covers a corner of the isolation and a corner of the first well region.

6. A semiconductor structure, comprising:
a capacitor structure, disposed on a substrate and comprising:
a first electrode, disposed over a first surface of the substrate;
a second electrode, disposed at the first surface and comprising a portion of the substrate, wherein the second electrode includes arsenic; and
a dielectric layer, disposed on the first surface of the substrate and between the first electrode and the second electrode;
a first doping region, disposed in the substrate under the second electrode, and having a conductivity type different from a conductivity type of the second electrode; and
a second doping region, disposed in the substrate and surrounding the first doping region and the second electrode, wherein a doping concentration of the first doping region is substantially greater than a doping concentration of the second doping region.

7. The semiconductor structure of claim 6, further comprising:

an isolation, disposed in the substrate surrounding the second electrode.

8. The semiconductor structure of claim 7, wherein a depth of the isolation is in a range of 2500 to 4000 angstroms.

9. The semiconductor structure of claim 7, wherein a portion of the isolation is disposed between the second doping region and second electrode, and a portion of the isolation separates the second doping region from the first surface of the substrate.

10. The semiconductor structure of claim 6, wherein a doping concentration of the first doping region is in a range of 3E14 to 1E15 atoms/cm³.

11. The semiconductor structure of claim 6, further comprising:

a third doping region, disposed at the first surface of the substrate and adjacent to the second electrode, wherein the third doping region and the second electrode are separated by an isolation.

12. The semiconductor structure of claim 11, wherein the third doping region is disposed in the second doping region, and a doping concentration of the third doping region is greater than a doping concentration of the second doping region.

13. A semiconductor structure, comprising:

a substrate;

a first well region disposed in the substrate and having arsenic dopants;

an isolation, disposed in the substrate and surrounding the first well region;

a second well region, disposed in the substrate under the first well region; and a third well region surrounding the second well region and at least a portion of the first well region, wherein

16 the second well region has a conductivity type different from that of the first well region, the third well region has a conductivity type identical to that of the second well region, and a doping concentration of the second well region is greater than that of the third well region.

14. The semiconductor structure of claim 13, wherein the first well region has a first width along a first orientation, and the second well region has a second width greater than the first width along the first orientation.

15. The semiconductor structure of claim 13, wherein the second well region covers a lower corner of the first well region.

16. The semiconductor structure of claim 13, wherein a depth of the isolation is in a range of 2500 to 4000 angstroms.

17. The semiconductor structure of claim 1, further comprising a dielectric layer, disposed between the gate structure and the first well region, wherein the dielectric layer is overlapped by the gate structure and covers a central portion of the first well region.

18. The semiconductor structure of claim 13, wherein the second well region covers an entirety of a bottom of the first well region and extends under the isolation to cover a lower corner of the isolation.

19. The semiconductor structure of claim 13, further comprising:

a gate structure, disposed over the substrate and overlapping the first well region; and a contact, electrically connected to a portion of the first well region exposed by the gate structure.

20. The semiconductor structure of claim 1, wherein a depth of the isolation is in a range of 2500 to 4000 angstroms.

* * * * *